United States Patent [19]
Smith

[11] 3,947,105
[45] Mar. 30, 1976

[54] PRODUCTION OF COLORED DESIGNS
[75] Inventor: Albert Ernest Smith, Riverside, Calif.
[73] Assignee: Technical Operations, Incorporated, Boston, Mass.
[22] Filed: Sept. 21, 1973
[21] Appl. No.: 399,367

[52] U.S. Cl. .................. 353/121; 353/20; 353/31; 353/84; 350/162 SF
[51] Int. Cl.$^2$ .................. G03B 21/00; G03B 21/14
[58] Field of Search ............ 353/20, 30, 31, 33, 34, 353/84, 121; 350/162 SF

[56] References Cited
UNITED STATES PATENTS

| | | | |
|---|---|---|---|
| 1,657,415 | 1/1928 | Smith | 353/33 |
| 1,788,135 | 1/1931 | Twyman et al. | 353/84 |
| 2,591,428 | 4/1952 | Harris et al. | 353/84 |
| 3,620,611 | 11/1971 | Parrent | 353/84 |
| R20,748 | 6/1938 | Bocca | 353/20 |

*Primary Examiner*—Richard E. Aegerter
*Assistant Examiner*—John W. Shepperd
*Attorney, Agent, or Firm*—Alfred H. Rosen; Frank A. Steinhilper

[57] ABSTRACT

Method and apparatus are described for producing a replica of a pattern composed of differently-colored zones, mutually exclusive areas of the replica being so encoded from zone to zone that when it is suitably illuminated, the light from each zone can be treated separately from the light from each of the other zones. Apparatus is also described for reconstructing from such separately treated light an image of the original pattern in which each zone may be given an arbitrary hue and intensity. The "color" of any one zone in such image can be black or white, as well as gray.

8 Claims, 7 Drawing Figures

RED (+) (A)   WHITE (+) (B)   GREEN (+) (C)   BLUE (+) (D)   BLACK (−) (E)

PRODUCTION OF COLORED DESIGNS

BACKGROUND OF THE INVENTION

In many arts, and especially in the textile industry, it is necessary to change one or more colors in an original pattern. In the textile industry, for example, the following problem is presented:

Given a swatch of material of a certain geometric design and color combination, is there a simple, quick and economically viable means by which a fabric user or designer can explore and specify other color variations of that particular geometric design?

The fabric industry currently solves this problem in a variety of ways, all of which introduce costly delays that the end user would like to eliminate. According to one procedure, a handwoven sample is made by a mill for submission to a clothing manufacturer. A reason for this practice derives from the fact that in the production of designs for woven fabrics no accurate idea of the appearance of the finished fabric can be obtained from drawings or paintings, except such as reproduce with enormous labor the most minute details of the textile. So great would the labor be in the production of adequate drawings and paintings that in practice another accepted procedure has been, once the weaving scheme is decided on, to set up a loom for the production of a number of color combinations from which are selected those which seem most suitable for the purpose for which the cloth is to be used. Alternatively, the manufacturer notifies the mill of the desired colors and the mill then hand-weaves another sample. This is also costly, as well as time consuming. Moreover, it is often found that the colors selected by the manufacturer, when woven in the original pattern, do not produce the desired aesthetic effect. It is then necessary to repeat the entire process.

It has been proposed to take a separate photographic negative of each of all the parts of a basic design and produce positive transparencies from the negatives, project beams of light through the several positives so as to reproduce the configuration of the basic design, and color the individual beams, varying their individual colors at will until the reproduced design has a desired appearance. U.S. Pat. Nos. 1,657,415 (Smith) and 1,788,135 (Twyman et al) describe such a scheme. In Twyman et al it is proposed to weave a fabric from threads of red, green and blue, these colors being so selected that they can be photographed through filters which would suppress in turn any two of the three colors. This scheme has the inherent problem of registration.

GENERAL DESCRIPTION OF THE INVENTION

In the invention now to be described, the art of producing patterns (or designs) of differently-colored zones (or components) occupying mutually-exclusive areas is advanced to a state in which a replica of the pattern can be constructed in a manner such that each individual zone of the pattern can be given arbitrarily any desired intensity of any desired color or hue, including black or white (which for purposes of the invention may be regarded as colors), it being understood that the term "intensity" as applied to black or white includes "gray". According to a general method of the invention, each component (or zone) is enabled to be colored independently of the others by first forming a separate record of each component, then encoding each record with a unique spatial carrier, and finally combining all of the so-encoded records to form a replica of the original pattern in which each component is located in its original relation to the other components. The product of this process can be used in a Fourier-transform optical reconstruction apparatus to provide an optical image of the original pattern in which each component can be arbitrarily colored or rendered in black or white (including gray) by properly locating selected filters in the apparatus. Alternatively, the pattern can be reconstructed with components arbitrarily colored using electronic techniques, again from the product of this process. Following is a description of an exemplary embodiment of the invention. This description refers to a textile fabric, but it will be understood that the invention is not so limited, but rather is useful in connection with patterns or designs realized in other media as well.

GENERAL DESCRIPTION OF THE DRAWINGS

FIG. 1 schematically illustrates a pattern or design having separate zones each of which may be uniquely colored or rendered in black or white;

FIG. 2 schematically illustrates a replica of FIG. 1 in which each zone is uniquely spatially encoded;

DETAILED DESCRIPTION OF THE DRAWINGS

Figure 1:
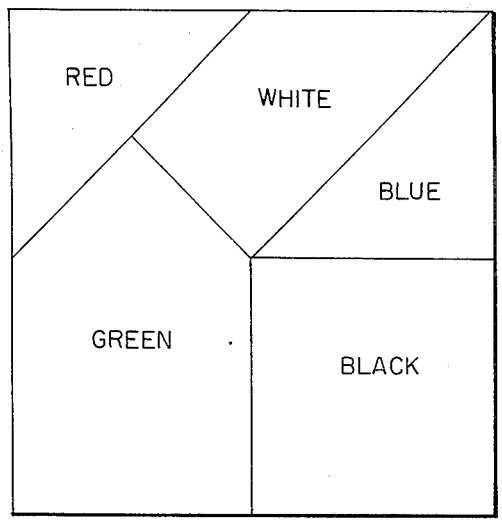

FIG. 1 shows in a simplified way a fabric design or a pattern of differently colored components occupying mutually exclusive areas of the total pattern. In this instance, five colors are shown. These are red, blue and green, and white and black which, for the purposes of this invention, are regarded as colors. The pattern, therefore, has five differently colored components, each occupying exclusively an area of the pattern. In practice these colored components will normally be intermixed in a much more complex manner since each color will be that of an individual thread or group of threads woven into the fabric.

Figure 2:
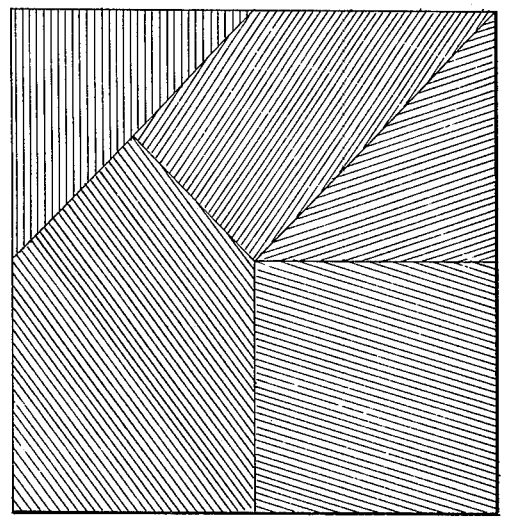

According to the present invention, it is desired to make, as by photographic means, a replica of the original pattern in which each colored component is encoded with a spatial carrier as is illustrated by way of example in FIG. 2. Thus, in FIG. 2 each colored component has imposed upon it a diffraction grating oriented at a unique angle relative to diffraction gratings that are imposed upon each of the other colored components. There being five different color components of the pattern, it is convenient to space the gratings about in azimuth by 36°. If FIG. 2 is a transparency, then illumination of it in a reconstruction and projection system of the Fourier-transform type, as is described and illustrated, for example, in U.S. Pat. No. 3,561,859, will enable the source of diffracted light for each of the colored components to be separately located in space, where it can be arbitrarily colored with the use of a filter or filters, as will be explained below, and then the entire design can be reassembled optically in the same or similar apparatus, with each color component bearing an arbitrarily assigned color. In this manner, using a single replica of the original pattern, a designer can examine with facility a virtually infinite variety of color combinations for that design.

Figure 3:
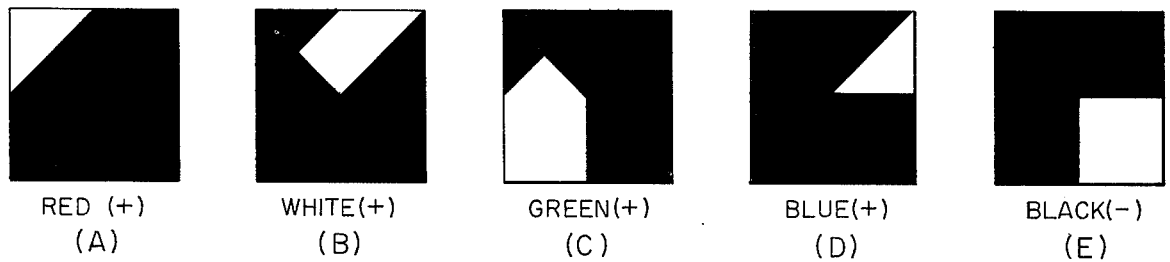
FIG. 3 is a group of intermediate transparencies each replicating one of the zones of FIG. 1.

The creation of a spatially-encoded replica of the original design is made through steps, some of which are known. FIG. 3 illustrates a group of intermediate transparencies which can be made by techniques that are known, for example, from U.S. Pat. No. 1,788,135, issued Jan. 6, 1931 to F. Twyman et al. FIG. 3 shows five separate transparencies, labelled (A) through (E), respectively. FIG. 3A is a transparency in the form of a photographic positive of the red component of FIG. 1. The portion corresponding to the red component is transparent while the rest of FIG. 3(A) is opaque. In FIG. 3B, also a photographic transparency, the portion corresponding to the white component of FIG. 1 is transparent, the remainder being opaque. In FIG. 3(C), there is shown a green positive in which the portion corresponding to the green component of FIG. 1 is transparent and the remainder is opaque. In FIG. 3(D), a blue positive, the portion corresponding to the blue component of FIG. 1 is transparent and the remainder is opaque. FIG. 3(E) shows a black negative in which the portion corresponding to the black component of FIG. 1 is transparent and the remainder is opaque. A scheme for making the group of intermediate transparencies shown in FIG. 3 is illustrated in FIG. 4.

Figure 4:
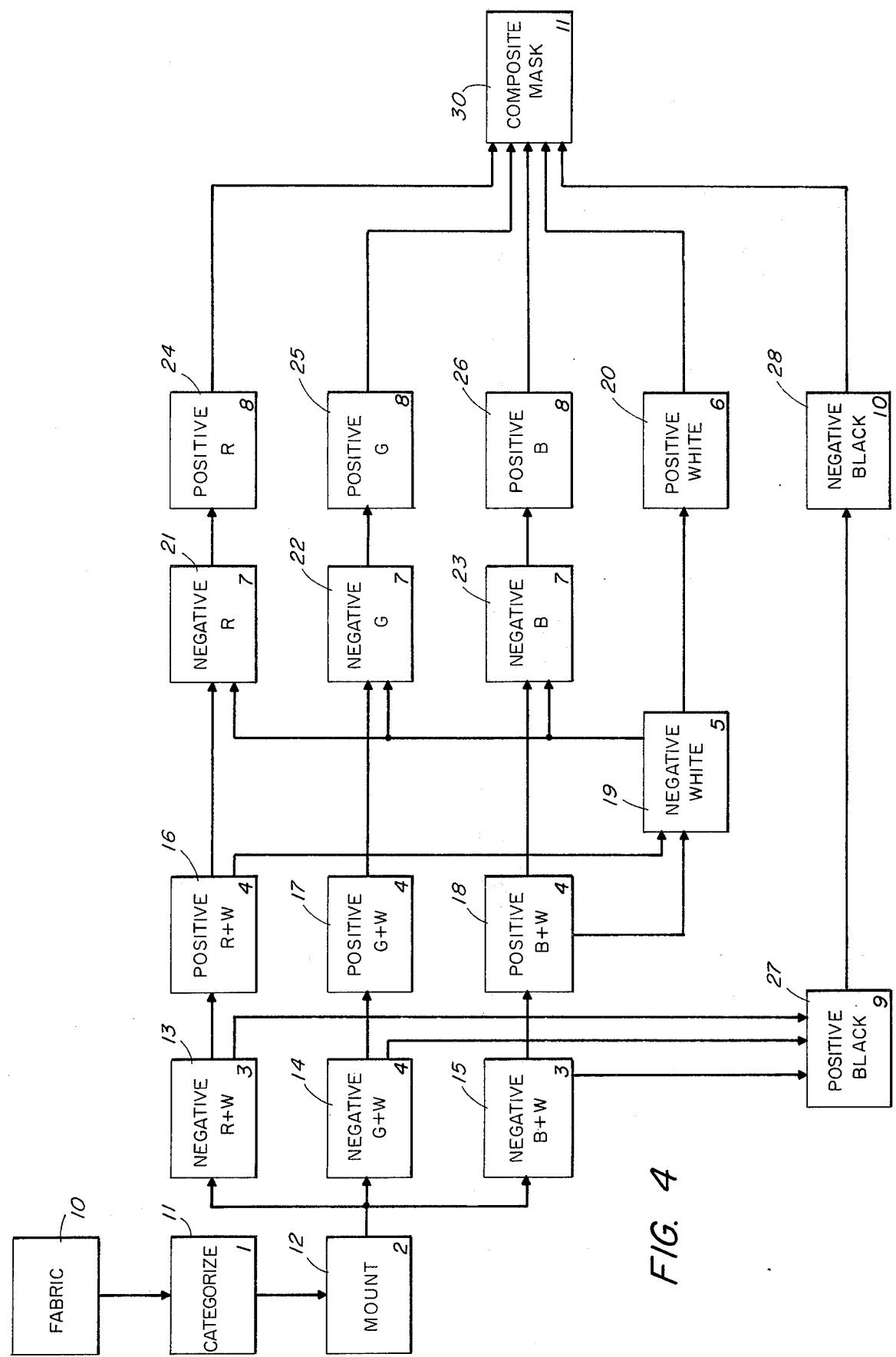
FIG. 4 is a block diagram representing the process flow for producing the intermediate transparencies of FIG. 3.

FIG. 4 shows in block diagram form the general process flow for producing the intermediate transparencies. One should distinguish between the prior-art tricolor separations, and the present five channel separation images. Tri-color separations of the prior art are the conventional black and white transparencies one obtains when copying with standard color separation filters. The red separation negative, for example, will have dark areas corresponding to areas of red, orange, yellow magenta, white or any red-component reflective color. The five channel separation images with which the present invention is concerned are mutually exclusive; that is, the red separation negative will be dark only in exclusively red patches and not in red mixture areas such as white. Steps in the process are numbered from "1" to "10" in the lower right-hand corner of the respective pertinent blocks. The description that follows will refer to these steps by number.

Block 10 represents the swatch of fabric that is to be photographed. Block 11 represents Step 1 entitled "Categorize." The first step refers to an initial inspection of the fabric swatch as a means to generate exposure data. One determines if the sample is a print or a weave, if the surface is diffuse or specular (soft or hard), if the overall reflectivity is high, low or average, if there are no more than five channels, and do the various channels have acceptable spectral reflectivity?

Mounting the swatch — Step 2 in block 12 — insures that the proper repeat cycle is copied and that a uniform size is obtained. It may also be desirable to annotate the sample at this step with an identification number and other information designations. The mounting frame should be designed to provide ease of handling in a copy camera, and the frame may contain exposure information gained in the categorization step.

The third step, blocks 13, 14, 15, is carried out with a copy camera having fixed uniform illumination provisions (3200° K) and color separation filters (for red the equivalent of Wratten 25, for green Wratten 58, and for blue Wratten 47B). A graphic arts copy camera of the kind used in the tricolor separation work can be used. Three tricolor separation negatives, representing, respectively, the Red and White, Green and White, and Blue and White, color contents of the fabric swatch will be made in Step 3. The tricolor separation negatives are then contact printed, for example onto Kodalith Ortho film, and suitably developed to produce correspondng separation positives, step 4, in blocks 16, 17, 18, respectively.

Any two of the positives from step 4 are then registered and contact printed to yield a separation negative, step 5, of the white zone, block 19. The same film and processing is used as in Step 4. The white zone negative is reduced to a positive by contact printing, — step 6 in block 20 — which corresponds to FIG. 3(B).

The seventh step is to register the white separation negative, block 19, with, in turn, each of the tricolor separation positives, blocks 16, 17, 18, respectively, and make a contact print through each combination, blocks 21, 22, 23, respectively. This eliminates the white zone contributions in the tricolor separations and yields exclusively red, green, and blue zonal separations, which in turn are reversed to positives in the contact prints of the eighth step, — blocks 24, 25 and 26, respectively, which in turn correspond to FIGS. 3(A), 3(C) and 3(D), respectively.

The ninth step consists of registering the red, green and blue tricolor negatives of blocks 13, 14 and 15 in a contact print to yield the black zone positive, block 27, and in the tenth step a contact print is made to produce the final black zone mask, block 28, which turns out to be a negative, corresponding to FIG. 3(E). That is, the black zone mask is clear in all the black areas and opaque everywhere else.

In the eleventh step, block 30, the five zonal separations in blocks 24, 25, 26, 20 and 28 are sequentially registered and copied in an encoding step, to provide a composite mask like that shown in FIG. 2. This may be done generally according to the printing method described by Carlo Bocca, U.S. Pat. No. 2,050,417 with reference to a set of three tricolor separation diapositives, which correspond to blocks 16, 17 and 18 in FIG. 4 of the present application. However, as Bocca points out in the paragraph on page 1, column 2, starting at line 27, all three systems of ruled lines will appear in those parts corresponding to the white areas of the subject photographed, and in the white parts the structure of the "projection diapositive" will appear as in Bocca's FIG. 1. Further, in the black parts the "projection diapositive" will not contain any ruling. In the present invention, owing to intervention of the steps which create the zonal separations, in blocks 20, 24, 25, 26 and 28, each zone, be it representative of a color or of black or white, has its own exclusive encoding, no zone has two or more encodings in it, and no zone is without any encoding. For encoding purposes, a diffraction grating having 200 lines per millimeter can be used, and the composite mask is made by sequential exposure through it of the five zonal separations, the grating being turned 36° from one exposure to the next. A Ronchi ruling in a metal film supported on a glass substrate for use as the grating.

Figure 5:
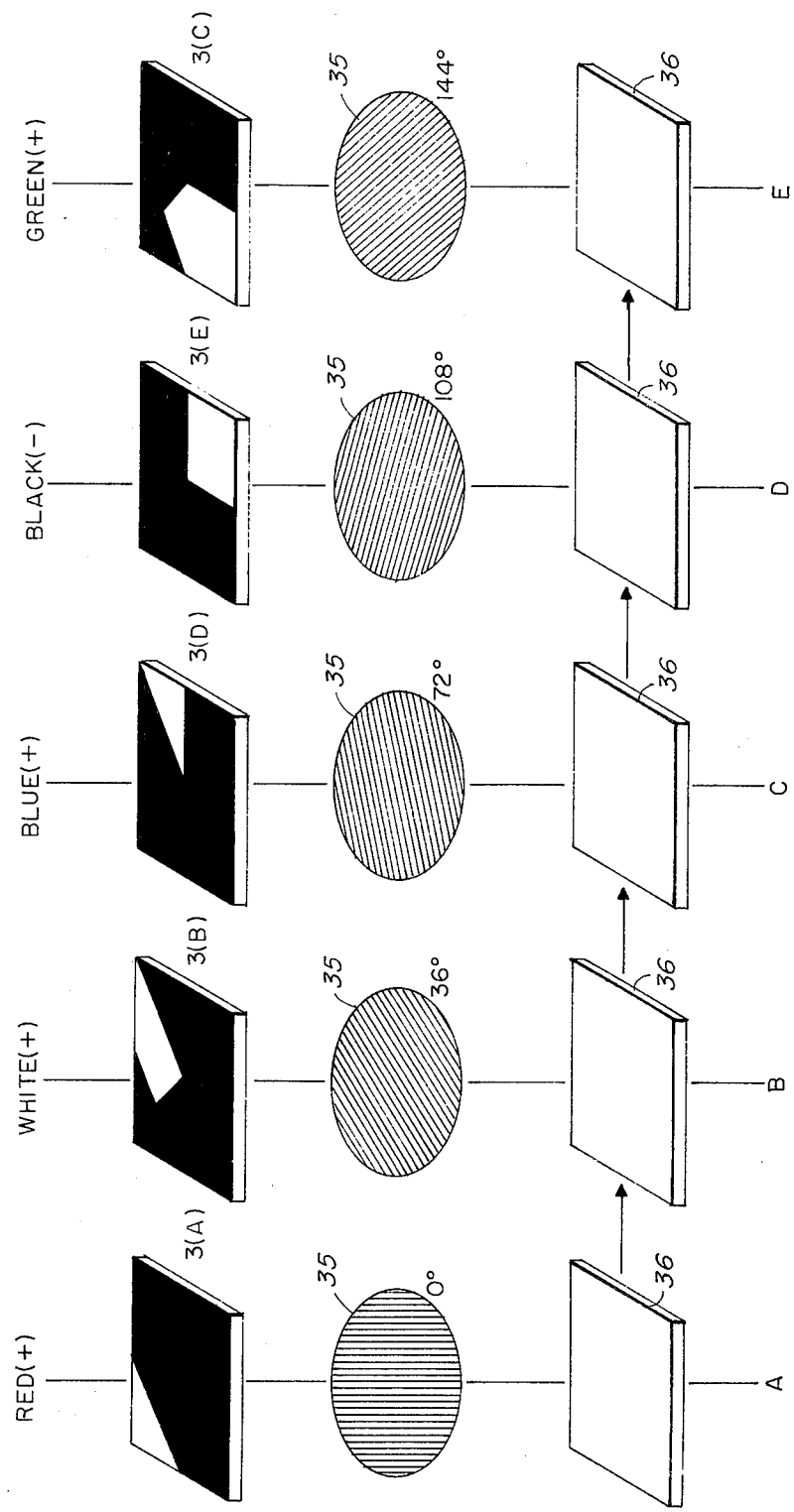
FIG. 5 illustrates the process flow for producing the spatially-encoded replica of FIG. 2 from the intermediate transparencies of FIG. 3.

FIG. 5 illustrates schematically the printing method used in the present invention. At FIG. 5A, the red positive 3(A), the grating 35 and the photographic receptor 36 are aligned for contact printing with the grating oriented at 0°. After exposure of the receptor through the red positive and the grating, the white positive 3(B) is substituted, the grating is turned 36°, and the receptor 36 is exposed through this configuration as shown in FIG. 5B. Next, the blue positive 3(D) is substituted, the grating 35 is turned an additional 36°, and the receptor is exposed through the configuration shown at FIG. 5(C). Next, the black negative 3(E) is substituted, the grating 35 is rotated an additional 36° (to 108°) and the receptor is exposed through the configuration shown in FIG. 5D. Finally, the green positive 3(C) is substituted, the grating is turned to 144°, and the receptor 36 is exposed through the configuration shown in FIG. 5E. Clearly, the order of exposures shown in FIG. 5 is arbitrary, and exemplary only. Whatever the order, it is obvious that each zone is printed on a separate and unique area of the receptor, and no double exposure can occur, assuming of course that proper precautions have been taken to assure registration of the successive zonal separations on the receptor 36. The receptor 36 is preferably a black-and-white photographic material, characterized by high resolution properties, and it is processed to produce a black-and-white transparency having the image configuration shown in FIG. 2.

Figure 6:
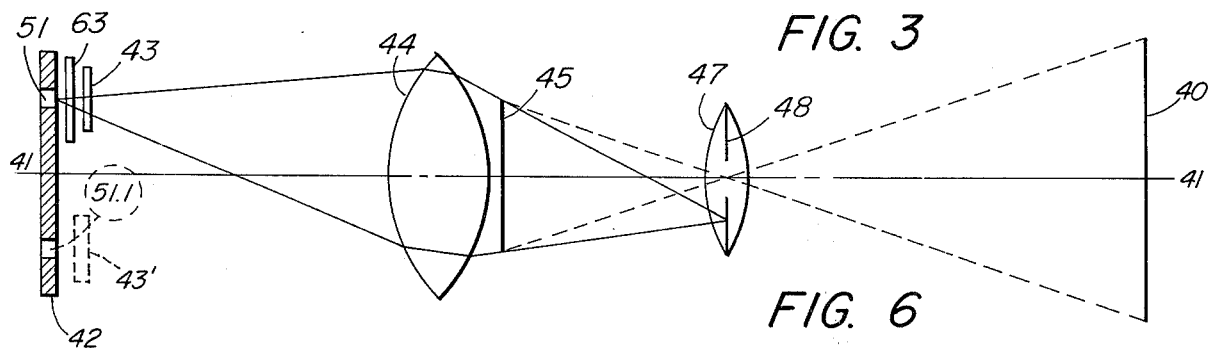
FIGS. 6 and 6A schematically illustrate an optical Fourier-transform apparatus for reproducing a replica of FIG. 1 with arbitrary color, or black or white in each zone.
Figure 6A:
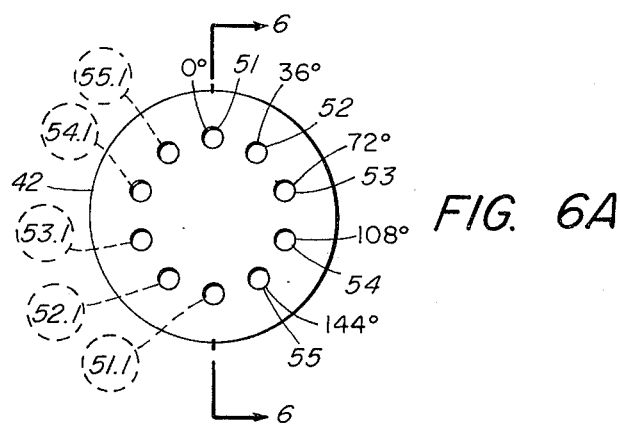

FIGS. 6 and 6A show an optical display system, similar in principle to that of U.S. Pat No. 3,561,859, which may be used to project on a screen 40 an image of the original pattern or design shown in FIG. 1, and in which each of the separate zones may be given any desired color, in any desired hue and intensity. The system is arranged along an optic axis 41—41. The principal components shown along the axis are a light-source mask 42, color filters 43, a transform lens 44, a slide or transparency 45 which corresponds to the encoded composite mask of FIG. 2, a projection lens 47 fitted with a stop 48, and the screen 40.

The light source mask 42 is shown in plan view in FIG. 6A. To simplify the illustration it is shown as a disc of preferably opaque material having an array of light source apertures 51, 52, 53, 54 and 55 through it. These apertures are arrayed on an arc and spaced 36° apart between pairs of adjacent apertures. Each aperture is at the location of a light source for one of the zones in the pattern, and the angular spacing between apertures corresponds to the angular spacing between grating lines encoding each of the zones. Those skilled in the art will recognize that each light source aperture 51–55, respectively, can have a cognate light source aperture 51.1 to 55.1, respectively, located diametrically opposite it in the disc 42. Likewise, those having such skill will realize that light can be supplied in the apertures either by locating individual lamps in them, or by bringing light into them from a remote source or sources via fiber-optic conductors, as two well-known examples. In any event, the aperture or pair of apertures locating the light source for each zone is fitted with spectral filter means to impart the desired color or hue to that zone. A filter 43 (or a pair of filters 43, 43') is shown in FIG. 6 in the path of light from the first (0°) light source aperture 51 (and its cognate aperture 51.1 if used), which lies in the longitudinal plane of the illustration and includes the axis 41—41. If desired, a neutral density filter, 63 for example, can be included in each light path in order to control the intensity of light in each zone.

If the light source aperture 51 labelled 0° in FIG. 6A is assumed to be located on a diameter running vertically through the disc 45 as seen in FIGS. 6 and 6A, then the transparency 45 will be placed in the system oriented about the axis 41—41 so that the encoded grating lines of the zone that is cooperatively related to that aperture will be disposed horizontally, that is, 90° around the axis relative to that vertical diameter. For convenience, assume that the originally-red zone, marked 0° in FIG. 2, is chosen to have its grating lines oriented horizontally in the display system. Then, as is taught in U.S. Pat. No. 3,561,859, first-order light of the diffraction pattern of the grating encoding that zone will pass on-axis through the projection lens stop 48, and zero-order light will be blocked by the stop. An image of the originally-red zone will be formed on the screen, and this image will look like the "red (+)" transparency in FIG. 3(A). However, with the spectral filter 43, this image can be given any desired color or hue, and with the neutral density filter it can be given any desired intensity.

In like manner, light source aperture 52 and appropriate filter means (not shown) can be used to construct the originally-white zone of the pattern or design in any desired color or hue, and intensity, light source aperture 53 can be used to construct the originally-blue colored zone in any desired color or hue, and intensity, and so forth. Especially unique is the fact that the originally black zone (FIG. 3(E)) can be reconstructed, with the aid of light source aperture 54, in any desired color or hue, and intensity, while any other zone can be reconstructed as black, or white, as desired, by either blocking, or leaving unfiltered spectrally, the light being used to reconstruct it. As is known to those skilled in the art, the grating lines that are used to encode the separated zones of the original design or pattern will not appear in the composite image reconstructed on the screen 40, or in any zonal components of it.

In the example described above, if the master or starting design or pattern configuration is embodied in a woven fabric 10, it will be desirable that the colored threads of the fabric be colored with an opaque ink or dye, and that the spectral range of each color be so narrow that it can be filtered to the substantial exclusion of all the other color components. This will facilitate the preparation of intermediate, or separation, transparencies which have sufficient contrast to yield a composite mask 30 which will give acceptable separation of the respective zones in the display system of FIG. 6. Prior art teachings which employ diffraction gratings to achieve optical separation by means of spatial carriers, like Bocca (cited above) and Thorp's British Pat. No. 11,466 of 1899, do not permit complete zonal separation of components of a pattern, since they contain more than one carrier in a given zone, or have zones with no carrier at all, nor do they recognize any purpose or utility in treating black or white (including gray) as individual "color" zones or components of the pattern.

The embodiments of the invention which have been illustrated and described herein are but a few illustrations of the invention. Other alternative arrangements may be made within the scope of this invention by those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention.

I claim:

1. In the art of producing visually-pleasing design patterns of differently colored components which occupy mutually-exclusive areas and which may include either or both of black and white as respective "color components," the method of producing a replica of an original pattern of components occupying mutually-exclusive areas, which replica is suitable for use in an imaging system for producing an image of said original pattern and for arbitrarily coloring each component over a selectible range of continuously variable intensity independent of the others in said image, which method comprises providing a master of said original pattern in which each component is photometrically separable substantially in its entirety from each of the other components, photometrically separating each component from the others to form a record of said component, modulating said record uniformly throughout its confines substantially exclusively with a spatial-frequency carrier having a unique azimuthal orientation and a spatial frequency capable of resolving the individual components, and combining all of the so-modulated records to form a single replica of the original pattern in which single replica each component is located in its original relation to the other components and bears its spatial carrier to the exclusion of the spatial carriers of all the other components, for visual examination of the collective effect of the components of said image of said original pattern when produced with the aid of said replica.

2. Method according to claim 1 comprising:
  a. forming a separate positive transparency of each of the color components except the black component, and forming a negative transparency of the black component, each transparency being substantially transparent in the area of its component and substantially opaque everywhere else, and
  b. modulating entirely the transparent portion of each transparency with said spatial frequency carrier.

3. Method according to claim 1 in which each spatial carrier is a diffraction grating overlying substantially the entire component area of the respective record that it modulates, characterized by the further step of preparing the replica by sucessively exposing a photoreceptor to each of said records through said grating and giving said grating a unique orientation for each record.

4. Method according to claim 1 in which there is provided a master of said original pattern in which each component bears color of such narrow spectral width that light from it can be filtered to the substantial exclusion of light from all the other components, which method comprises:
  a. forming a separate positive transparency of each of the colored components and the white component, and forming a negative transparency of the black component, each transparency being substantially transparent in the area of its respective components and substantially opaque everywhere else,
  b. modulating entirely the transparent portion of each transparency with a diffraction grating having unique orientation for each component, and
  c. exposing the same photoreceptor to each of the so modulated transparencies while maintaining registration to produce on the photoreceptor an encoded image which is a replica of said pattern.

5. In the art of reproducing visually pleasing design patterns of differently-colored components occupying mutually-exclusive areas of an original pattern, and which may include either or both of black and white as respective "color components", the method of arbitrarily coloring each component of a reproduced pattern over a selectible range of continuously variable intensity independent of and in unison with all the others for comparative examination of such design patterns as a whole, which comprises providing a master of said original pattern in which each component is photometrically separable from all the others, photometrically separating each component from the others to form a record of said component, modulating said record uniformly throughout its confines substantially exclusively with a spatial-frequency carrier having a unique azimuthal orientation and a spatial frequency capable of resolving the individual components, combining all of the so-modulated records to form a single replica of the original pattern in which single replica each component is located in its original relation to the other components and bears its spatial carrier to the exclusion of the spatial carriers of all the other components, illuminating said replica with light and modulating said light with said respective spatial carriers so as to diffract in a separate direction light that is representative of each of said respective components for separating light that is representative of each component substantially entirely from light that is representative of any of the others of said components, arbitrarily coloring the light that is representative of each of said components over a selectible range of continuously-variable intensity, forming from the light of all said components in unison an image of said replica, for visual evaluation of the collective effect of the components of said pattern and, making a selection on an artistic basis of images of said replica which bear visually pleasing combinations of colored components.

6. Method according to claim 5 comprising illuminating said replica with a plurality of light beams there being at least one beam for each color component of the pattern, the beam or beams for each component being each located at an angle to the replica that is so related to the spatial carrier of that component that nth-order diffracted light from each said beam falls on a common axis with nth-order diffracted light from all said beams ("n" being an integer greater than zero which is not necessarily the same for the beam or beams for each component), and arbitraily coloring the light of each of said beams prior to incidence of said light upon said replica.

7. Method according to claim 5 comprising the additional steps of:
  a. forming a separate positive transparency of each of the color components except the black component, and forming a negative transparency of the black component, each transparency being substantially transparent in the area of its respective component and substantially opaque everywhere else, and
  b. forming said single replica by exposing a photoreceptor successively to each of said transparencies through a diffraction grating, while giving said grating a unique orientation for each exposure.

8. Method according to claim 7 comprising illuminating said replica with a plurality of light beams there being at least one beam for each color component of the pattern, the beam or beams for each component being each located at an angle to the replica that is also so related to the orientation of the grating of that component that nth-order diffracted light from each said beam falls on a common axis with nth-order diffracted light from all said beams ("n" being an integer greater than zero which is not necessarily the same integer for the beam or beams for each component), and arbitrarily coloring the light of one or more of said beams prior to incidence of said light upon said replica.

* * * * *

UNITED STATES PATENT OFFICE
CERTIFICATE OF CORRECTION

Patent No. 3,947,105          Dated March 30, 1976

Inventor(s) Albert Ernest Smith

It is certified that error appears in the above-identified patent and that said Letters Patent are hereby corrected as shown below:

Column 3, line 67, after "frame" insert -- margin --

Column 7, line 44, after "its" insert -- respective --

Signed and Sealed this

Fourteenth Day of September 1976

[SEAL]

Attest:

RUTH C. MASON
*Attesting Officer*

C. MARSHALL DANN
*Commissioner of Patents and Trademarks*